(12) United States Patent
Dumitrescu et al.

(10) Patent No.: US 7,098,753 B1
(45) Date of Patent: Aug. 29, 2006

(54) OSCILLATOR WITH VARIABLE REFERENCE

(75) Inventors: Gabriel-Gheorghe Dumitrescu, San Jose, CA (US); Jon E. Opris, San Jose, CA (US)

(73) Assignee: Silicon Clocks, Inc., Fremont, CA (US)

( * ) Notice: Subject to any disclaimer, the term of this patent is extended or adjusted under 35 U.S.C. 154(b) by 0 days.

(21) Appl. No.: 10/856,202

(22) Filed: May 28, 2004

Related U.S. Application Data

(60) Provisional application No. 60/478,628, filed on Jun. 13, 2003.

(51) Int. Cl.
*H03B 1/00* (2006.01)
(52) U.S. Cl. .................................. 331/182; 331/185
(58) Field of Classification Search .............. 331/185, 331/16, 182, 183
See application file for complete search history.

(56) References Cited

U.S. PATENT DOCUMENTS

| | | | |
|---|---|---|---|
| 3,223,928 A | 12/1965 | Fayman | |
| 3,281,648 A | 10/1966 | Collins | |
| 3,378,769 A | 4/1968 | Luzzatto | |
| 4,121,163 A | 10/1978 | Fikart | |
| 4,297,654 A | 10/1981 | Goerth | |
| 4,320,531 A | 3/1982 | Dimon | |
| 5,047,734 A * | 9/1991 | Newell et al. ................. | 331/46 |
| 5,077,546 A | 12/1991 | Carfi et al. | |
| 5,113,153 A | 5/1992 | Soyuer | |
| 5,113,156 A | 5/1992 | Mahabadi et al. | |
| 5,396,659 A | 3/1995 | Kimura | |
| 5,463,356 A | 10/1995 | Palmer | |
| 5,552,734 A | 9/1996 | Kimura | |
| 5,661,424 A | 8/1997 | Tang | |
| 5,878,332 A | 3/1999 | Wang et al. | |
| 5,912,594 A | 6/1999 | Burkhard | |
| 5,959,505 A * | 9/1999 | Ushiyama ................... | 331/158 |
| 6,052,036 A | 4/2000 | Enstrom et al. | |
| 6,064,277 A * | 5/2000 | Gilbert ................... | 331/117 R |
| 6,100,731 A | 8/2000 | Otaka | |
| 6,121,849 A * | 9/2000 | McCollough et al. ........ | 331/175 |
| 6,137,375 A * | 10/2000 | Li ............................... | 331/175 |
| 6,252,438 B1 | 6/2001 | Sasaki | |
| 6,313,712 B1 | 11/2001 | Mourant et al. | |

(Continued)

OTHER PUBLICATIONS

Wenzel Associates, Inc., "VCXOs—Voltage-Controlled Crystal Oscillators," Jun. 2003, located at http://www.wenzel.com/documents/vcxo.html.

(Continued)

*Primary Examiner*—Joseph Chang
(74) *Attorney, Agent, or Firm*—Carr & Ferrell LLP

(57) ABSTRACT

A circuit for varying an amplitude of an oscillation signal comprises an oscillator, signal processing circuitry, a first feedback circuit, and a second feedback circuit. The oscillator generates the oscillation signal and has a control input to vary the amplitude of the oscillation signal. The signal processing circuitry processes the oscillation signal. The first feedback circuit is configured to control the control input of the oscillator by comparing a reference value and an input amplitude of an input of the signal processing circuitry. The second feedback circuit generates the reference value by comparing an output amplitude of an output of the signal processing circuitry and a predetermined value.

28 Claims, 9 Drawing Sheets

U.S. PATENT DOCUMENTS

| | | |
|---|---|---|
| 6,333,679 B1 | 12/2001 | Eriksson |
| 6,340,920 B1 | 1/2002 | Tseng |
| 6,385,266 B1 | 5/2002 | Haberle et al. |
| 6,456,143 B1 | 9/2002 | Masumoto et al. |
| 6,466,064 B1 | 10/2002 | Kurogouchi et al. |
| 6,542,042 B1 | 4/2003 | Atkinson |
| 6,591,091 B1 | 7/2003 | Vorenkamp et al. |
| 6,696,898 B1 | 2/2004 | Ward et al. |
| 2001/0043109 A1 | 11/2001 | Masumoto et al. |
| 2001/0054919 A1 | 12/2001 | Wang |
| 2002/0125924 A1 | 9/2002 | Kurogouchi et al. |
| 2002/0183018 A1 | 12/2002 | Veit |
| 2003/0025537 A1 | 2/2003 | Laws |
| 2003/0119466 A1 | 6/2003 | Goldman |
| 2004/0056728 A1 | 3/2004 | Dent et al. |
| 2004/0140857 A1 | 7/2004 | Ogiso |
| 2005/0083140 A1 | 4/2005 | Hashimoto |

OTHER PUBLICATIONS

Chattopadhyay, G. et al., "Frequency Multiplier Response to Spurious Signals and Its Effect on Local Oscillator Systems in Millimeter and Submillimeter Wavelengths," Proceedings of the SPIE, Aug. 25-28, 2002.

Shin, H. et al., "A 1.8-V 6/9-GHz Switchable Dual-Band Quadrature LC VCO in SiGe BICMOS Technology," Proceedings of the 2002 IEEE Radio Frequency Integrated Circuits Symposium, Jun. 2-4, 2002.

* cited by examiner

7,098,753 B1

OSCILLATOR WITH VARIABLE REFERENCE

CROSS-REFERENCE TO RELATED APPLICATIONS

This application hereby incorporates by reference U.S. Provisional Patent Application No. 60/478,628, filed Jun. 13, 2003, entitled "A Semiconductor Integrated Circuit for Frequency Multiplication". This application is also related to co-pending U.S. patent application Ser. No. 10/857,054 entitled "Systems and Methods for Generating an Output Oscillation Signal with Low Jitter," filed May 28, 2004, which is hereby incorporated by reference. This application is also related to co-pending U.S. patent application Ser. No. 10/857,241, entitled "Tunable Differential Crystal Oscillator," filed May 28, 2004, which is hereby incorporated by reference.

BACKGROUND OF THE INVENTION

1. Field of the Invention

This invention relates generally to oscillators and more specifically to oscillators with variable reference.

2. Description of the Background Art

For signal processing circuitry to operate linearly and optimally process an analog signal, the analog signal should be within a limited range of amplitude. For example, if an input signal to the signal processing circuitry is too low in amplitude, noise that is present in the signal processing circuitry represents a relatively large part of the input signal. The input signal that is too low in amplitude results in a poor signal-to-noise ("S/N") ratio in an output of the signal processing circuitry. Conversely, if the input signal to the signal processing circuitry is too high in amplitude, then the signal processing circuitry can operate nonlinearly, resulting in distortion or "clipping" in the output.

FIG. 1 illustrates circuitry including automatic gain control ("AGC") in the prior art. AGC 110 detects an output amplitude at an output 130 of the signal processing circuitry 100 to control the gain of a gain adjustment amplifier 120 in the signal processing circuitry 100. If the output amplitude at the output 130 is too low in amplitude, then the AGC 110 increases the gain of the gain adjustment amplifier 120. Conversely, if the output amplitude at the output 130 is too high in amplitude, then the AGC 110 decreases the gain of the gain adjustment amplifier 120.

One problem with the AGC approach of FIG. 1 is that extraneous components are required in the signal processing circuitry 100 to support the AGC function, but are not otherwise needed. For example, the gain adjustment amplifier 120 of FIG. 1 is necessary for AGC, but does not perform any signal processing function in the signal processing circuitry 100. Another problem is that extraneous components in the signal processing circuitry 100 contribute undesired noise and/or distortion in the output of the signal processing circuitry 100.

FIG. 2 illustrates a circuit 200 to control an amplitude of an oscillation signal in the prior art. The circuit 200 limits an amplitude of the oscillation signal at an input 210 of the signal processing circuitry 240 to within a predetermined range. An oscillator 222 generates the oscillation signal that a buffer 215 amplifies to create the input 210 of signal processing circuitry 240. A peak detector 230 compares the input amplitude at the input 210 of the signal processing circuitry 240 to a predetermined range 235 and generates a control signal 250 to control the amplitude of the oscillator 222. The amplitude of the oscillation signal is adjusted based upon a desired input amplitude at the input 210 of the signal processing circuitry 240.

The approach of FIG. 2 excites oscillation in the oscillator 222, minimizes phase noise or jitter in the oscillation signal at the input 210 or input 260, or reduces the power consumed by the oscillator 222. However, one problem with the circuitry 200 of FIG. 2 is that the amplitude of the oscillation signal generated by the oscillator 222 is based upon only a predetermined range of amplitude, and not upon the actual amplitude of signals at some node in the signal processing circuitry 240 or another component following or "downstream" of the oscillator 222 such as the comparator 270. For example, the amplitude of the signal at the input 260 to the comparator 270 may be too high for the comparator 270 to operate optimally if the signal processing circuitry 240 experiences an increase in its gain characteristics due to process variations, voltage fluctuations in a power supply (not shown) powering the signal processing circuitry 240, and/or a change in operating temperature of the signal processing circuitry 240.

Therefore, a need exists to address the aforementioned deficiencies and inadequacies.

SUMMARY OF THE INVENTION

A circuit for varying an amplitude of an oscillation signal comprises an oscillator, signal processing circuitry, a first feedback circuit, and a second feedback circuit. The oscillator generates the oscillation signal and has a control input to vary the amplitude of the oscillation signal. The signal processing circuitry processes the oscillation signal. The first feedback circuit controls the control input of the oscillator by comparing a reference value and an input amplitude at an input of the signal processing circuitry. The second feedback circuit generates the reference value by comparing an output amplitude at an output of the signal processing circuitry and a predetermined range.

A method for varying the amplitude of the oscillation signal comprises generating the oscillation signal in the oscillator having the control input to vary the amplitude of the oscillation signal, processing the oscillation signal in signal processing circuitry, comparing the output amplitude at the output of the signal processing circuitry to the predetermined range in a second feedback circuit, generating a reference value based upon the comparison, and controlling the control input of the oscillator in the first feedback circuit based upon the reference value and the input amplitude at the input to the signal processing circuitry.

As a result of providing two feedback circuits in the oscillator with variable reference, the output amplitude of the output is held constant even if changes occur in a gain of a signal path through the signal processing circuitry. Small variations in the gain of the signal path caused by, for example, process variations, operating temperature changes, and/or power supply voltage fluctuations, accumulate and result in large variation at the output. Regulating the amplitude of the initial oscillation signal with two feedback circuits maintains the output amplitude of the output within the predetermined range. Additionally, the output amplitude of the output is maintained within the predetermined range at an input of circuitry following the signal processing circuitry. Furthermore, the variable reference provides compensation for losses caused by external tuning capacitors or varactors (e.g., voltage-controlled crystal oscillator applications) due to tuning of the oscillator.

DETAILED DESCRIPTION OF THE INVENTION

The embodiments discussed herein are illustrative of one example of the present invention. As embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

Figure 3A:
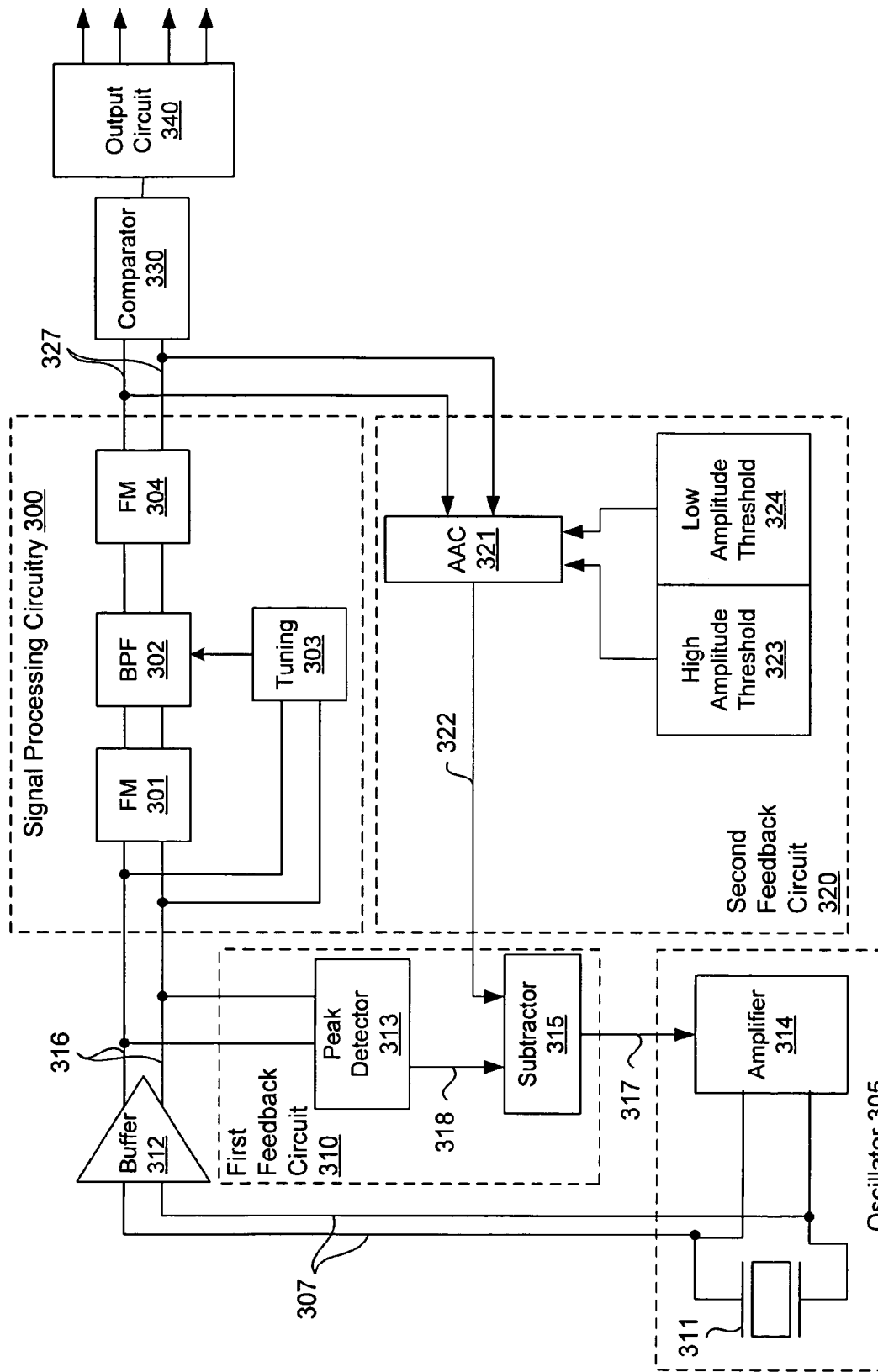
FIG. 3A illustrates a block diagram of an oscillator with variable reference in one embodiment of the invention.

FIG. 3A illustrates a block diagram of an oscillator with variable reference in one embodiment of the invention. An oscillator 305 comprises a resonator 311 and an amplifier 314 to generate an oscillation signal 307. The oscillator 305 includes a control input 317 to vary the amplitude of the oscillation signal 307. A buffer 312 amplifies the oscillation signal 307 to provide an input 316 of signal processing circuitry 300 at an input amplitude. The signal processing circuitry 300 processes the amplified oscillation signal to create an output 327 at an output amplitude. The exemplary signal processing circuitry 300 comprises a first frequency multiplier 301, a bandpass filter ("BPF") 302, a tuning circuit 303 to tune the BPF 302, and a second frequency multiplier 304. The first frequency multiplier 301 multiplies the oscillation signal 307 to result in a first frequency and first undesired frequency components. The bandpass filter ("BPF") 302 minimizes the first undesired frequency components. The second frequency multiplier 304 multiplies the first frequency to result in a second frequency and second undesired frequency components. Co-pending U.S. patent application Ser. No. 10/857,054, entitled "Systems and Methods for Generating an Output Oscillation Signal with Low Jitter," filed May 28, 2004, describes the exemplary signal processing circuitry 300 in more detail. After the signal processing circuitry 300, a comparator 330 converts the output 327 to a digital waveform. An output circuit 340 converts the digital waveform to multiple digital signal formats.

Two feedback circuits control the amplitude of the oscillation signal 307 generated in the oscillator 305. A first feedback circuit 310 is any circuitry configured to control the control input 317 of the oscillator 305 to vary the amplitude of the oscillation signal 307 by comparing a reference value 322 and an input amplitude at an input 316 from the signal processing circuitry. A second feedback circuit 320 is any circuitry configured to generate the reference value 322 by comparing the output amplitude of the output 327 from the signal processing circuitry 300 and a predetermined range.

As will be appreciated by a skilled artisan, the predetermined range is determined based upon process variations, power supply voltage variations, environmental factors, and other determinants that affect gain and distortion characteristics of the signal processing circuitry 300 and/or circuitry following (i.e., downstream of) the signal processing circuitry 300. In one embodiment, the predetermined range is determined as a range of output amplitude of the output 327 that provides optimal analog-to-digital conversion performance in the comparator 330. For example, the comparator 330 of one embodiment comprises a single-bit comparator, i.e., a zero-crossing detector (not shown) to convert the output 327 from the signal processing circuitry 300 into a digital output signal. If the output amplitude of the output 327 is too low at the input to the comparator 330, then the comparator 330 generates jitter because of noise. If the output amplitude of the output 327 is too high at the input to the comparator 330, then the comparator 330 generates jitter because of distortion. For optimal conversion performance with the least noise or jitter in the comparator 330, the output amplitude of the output 327 should be in the predetermined range. In signal processing circuitry 300 that comprises amplification, only a small adjustment is needed to the amplitude of the oscillation signal 307 to result in a large change at the output amplitude of the output 327 from the signal processing circuitry 300.

The amplitude of the oscillation signal 307 is controlled by the first feedback circuit 310 and the second feedback circuit 320 via the control input 317. One example of the first feedback circuit 310 comprises a peak detector 313 and a subtractor 315. As described in detail below in conjunction with FIG. 6, the peak detector 313 of the exemplary embodiment converts the input amplitude of the input 316 from the signal processing circuitry 300 into an input signal 318. As described in detail below in conjunction with FIG. 8, the subtractor 315 of the exemplary embodiment converts the reference value 322 to a reference current and generates the control input 317 based upon a comparison between a reference value 322 and the input signal 318.

One example of the second feedback circuit 320 comprises an automatic amplitude control ("AAC") 321 to generate the reference value 322. The reference value 322 is any value or signal indicating a comparison between an output amplitude of the output 327 from the signal processing circuitry 300 and the predetermined range. As described below in conjunction with FIG. 7, the reference value 322 of the exemplary embodiment comprises a four-bit digital word. In other embodiments, the reference value 322 is an analog signal. The reference value 322 is generated based upon a comparison of the output amplitude of the output 327 from the signal processing circuitry 300 and the predetermined range comprising a low amplitude threshold 324 and a high amplitude threshold 323.

Although the AAC 321 is illustrated in FIG. 3A as generating the reference value 322 based upon the output amplitude of the output 327 from the signal processing circuitry 300, in some embodiments the signal processing circuitry 300 comprises multiple signal processing elements in series and/or in parallel. In such an embodiment, the AAC 321 is configured to generate the reference value 322 based upon the output amplitude of an output between signal processing elements within the signal processing circuitry 300. In other embodiments, the AAC 321 generates the reference value 322 based upon the output amplitude of outputs from other signal processing elements (not shown) following the signal processing circuitry 300. In other embodiments, the AAC 321 is configured to generate the reference value 322 based upon output amplitudes of multiple outputs within or following the signal processing circuitry 300.

Figure 3B:
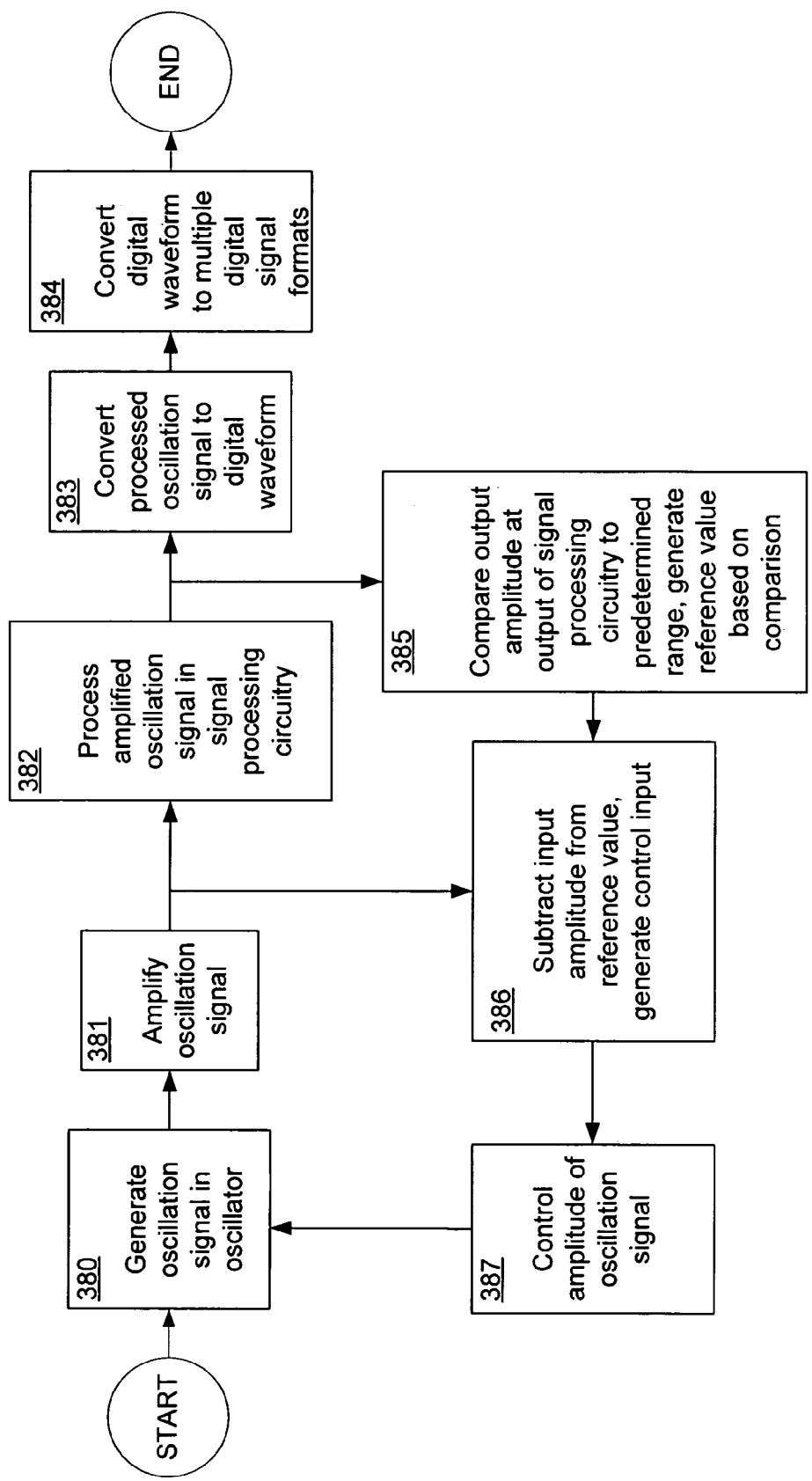
FIG. 3B illustrates a method of controlling the oscillator with variable reference in one embodiment of the invention.

FIG. 3B illustrates an exemplary method of controlling the oscillator with variable reference in one embodiment of the invention. At step 380, the oscillator 305 (FIG. 3A) generates the oscillation signal 307 (FIG. 3A). The oscillator 305 includes the control input 317 (FIG. 3A) to vary the amplitude of the oscillation signal 307. At step 381, the buffer 312 (FIG. 3A) amplifies the oscillation signal 307 to create the input 316 (FIG. 3A) of the signal processing circuitry 300 (FIG. 3A) at the input amplitude. At step 382, the signal processing circuitry 300 processes the amplified oscillation signal to create the output 327 (FIG. 3A) at the output amplitude. At step 383, the comparator 330 (FIG. 3A) converts the output 327 to the digital waveform. At step 384, the output circuit 340 (FIG. 3A) converts the digital waveform to multiple digital signal formats. At step 385, the AAC 321 (FIG. 3A) of the second feedback circuit 320 (FIG. 3A) compares the output amplitude of the output 327 from the signal processing circuitry 300 to the predetermined range between the low amplitude threshold 324 (FIG. 3A) and the high amplitude threshold 323 (FIG. 3A). Also at step 385, the AAC 321 generates a reference value 322 (FIG. 3A) based upon the comparison. At step 386, the first feedback circuit 310 (FIG. 3A) controls the control input 317 of the oscillator 305 based upon the reference value 322 and the input amplitude of the input 316 to the signal processing circuitry 300. The subtractor 315 of the first feedback circuit 310 compares the input signal 318 and the reference value 322 to generate the control input 317. At step 387, the amplifier 314 (FIG. 3A) controls the amplitude of the oscillation signal 307 generated in the oscillator 305 based upon the control input 317.

As a result of providing two feedback circuits in the embodiment of the oscillator with variable reference of FIG. 3A, the signal processing circuitry 300 operates in its linear range, and the output amplitude of the output 327 is maintained within the predetermined range at the input of the comparator 330. The output amplitude of the output 327 is maintained within the predetermined range even if gain and distortion characteristics of the signal processing circuitry 300 experience a change, such as may occur with process variations, voltage fluctuations, and/or a change in operating temperature of the signal processing circuitry 300. Additionally, the variable reference provides compensation for losses caused by external crystal tuning capacitors or varactors (e.g., VCXO applications) due to tuning of the oscillator 305 as described below in reference to FIG. 4.

Figure 1:
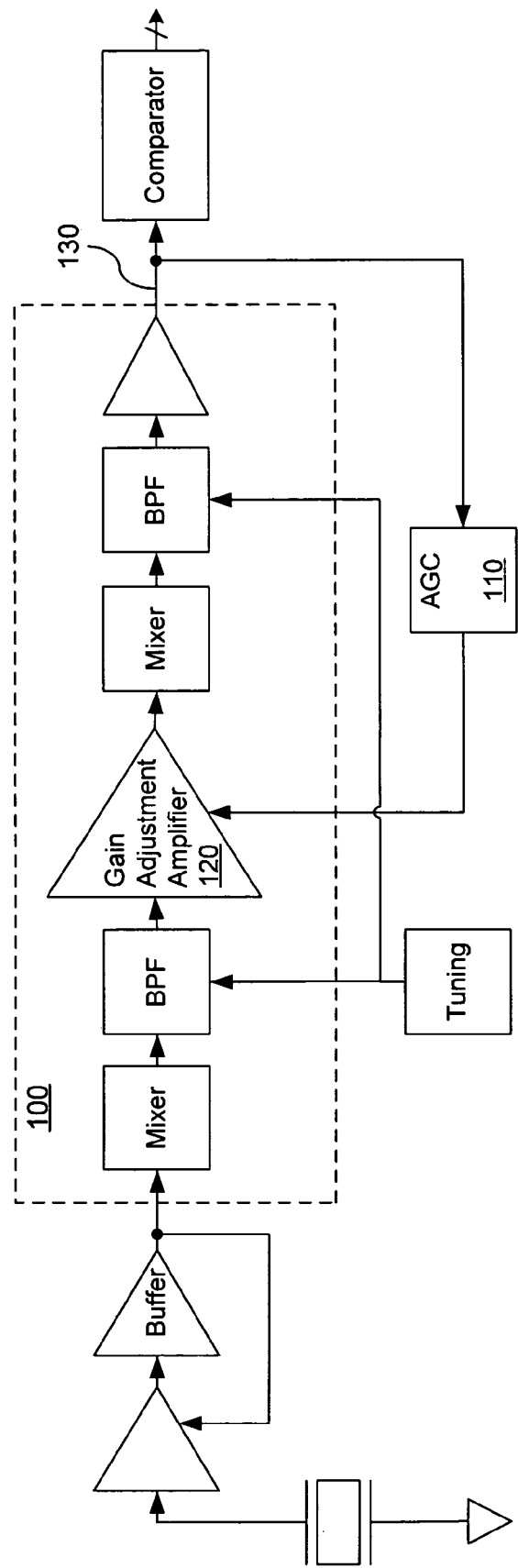
FIG. 1 illustrates circuitry including automatic gain control ("AGC") in the prior art.
Figure 2:
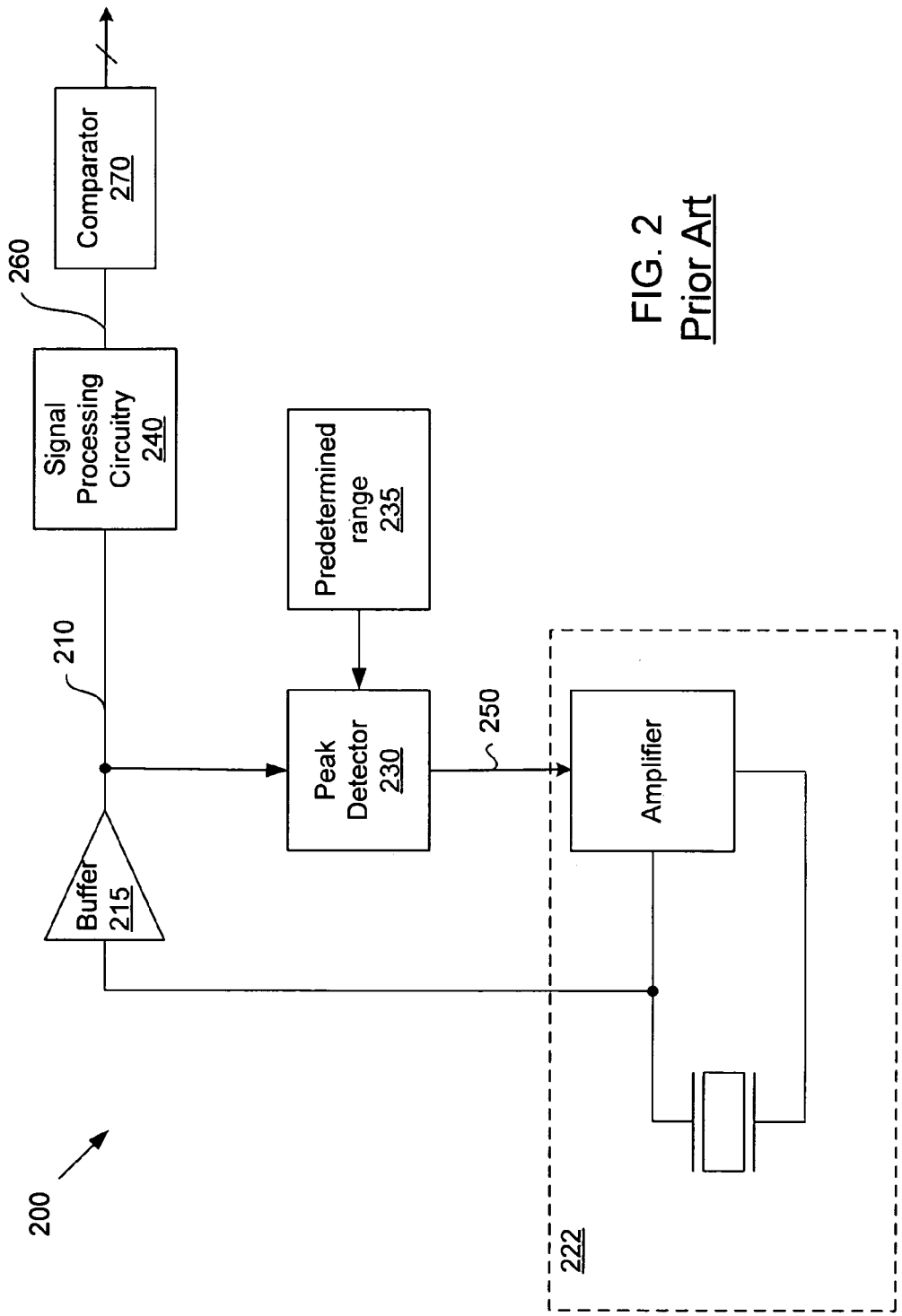
FIG. 2 illustrates a circuit to control an amplitude of an oscillation signal in the prior art.

Another advantage is that a signal path through the signal processing circuitry 300 comprises the minimum number of components, and only those components that are necessary for signal processing. Eliminating extraneous components from the signal path reduces the number of potential noise sources that can degrade the oscillation signal 307. As a result of providing AAC 321 feedback to the first feedback circuit 310, the amplitude control is essentially "noiseless" as compared to an AGC 110 (FIG. 1) that requires a gain adjustment amplifier 120 (FIG. 1) in the signal processing circuitry 300.

Figure 4:
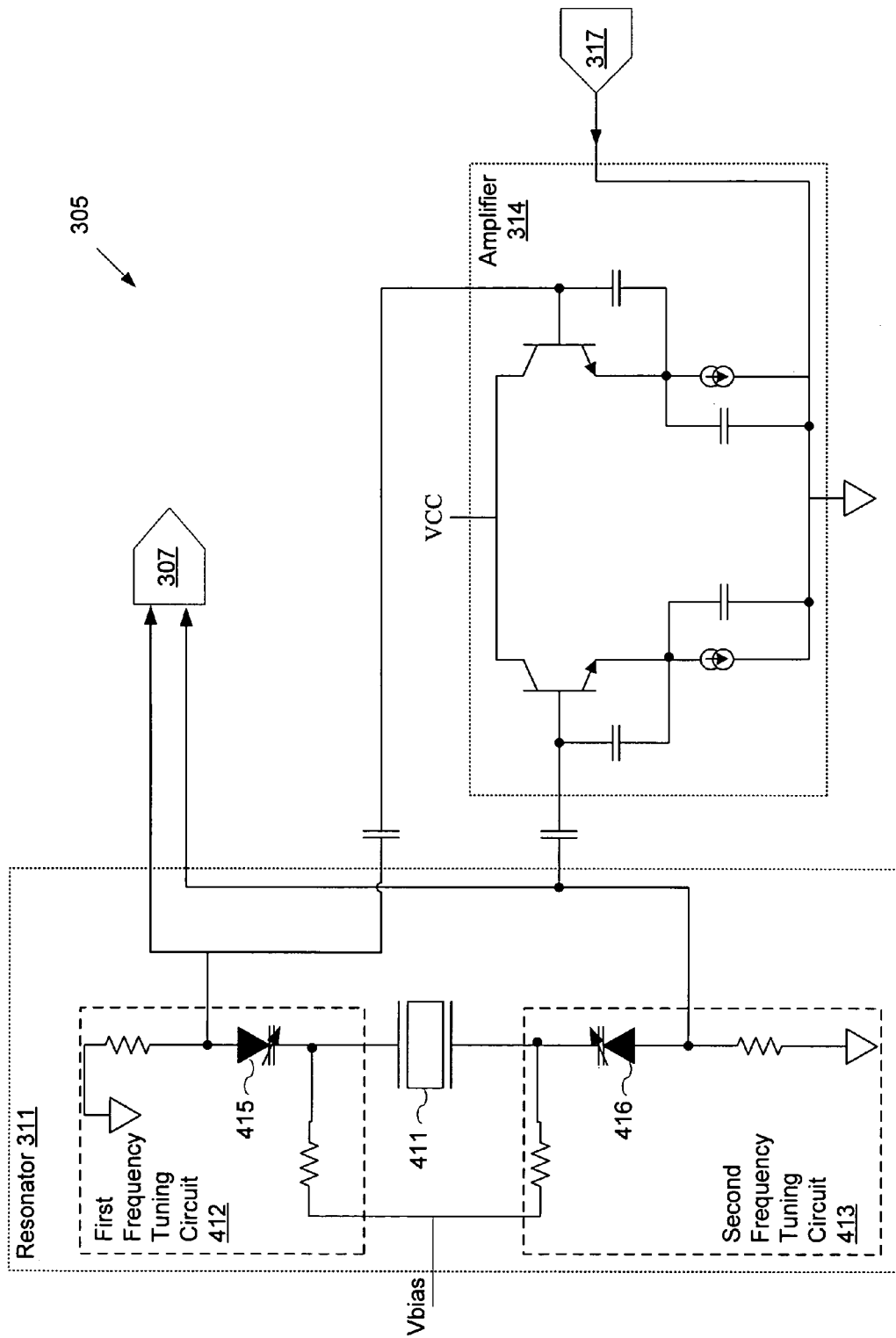
FIG. 4 illustrates a schematic drawing of the oscillator of FIG. 3A in one embodiment of the invention.

FIG. 4 illustrates a schematic drawing of the oscillator 305 of FIG. 3A in one embodiment of the invention. The oscillator 305 (FIG. 3A) of this embodiment comprises a resonator 311 (FIG. 3A) and amplifier 314 (FIG. 3A). This embodiment of the oscillator 305 is detailed further in co-pending U.S. patent application Ser. No. 10/857,241, entitled "Tunable Differential Crystal Oscillator," filed May 28, 2004. The resonator 311 comprises a resonating element 411, a first frequency tuning circuit 412, and a second frequency tuning circuit 413. The resonating element 411 resonates at a natural frequency. Some examples of the resonating element 411 include a quartz crystal, an LC circuit, a surface-acoustic wave resonator, and a ceramic resonator. The first frequency tuning circuit 412 comprises a varactor 415. The second frequency tuning circuit 413 comprises a varactor 416. Some examples of the varactor 415 and the varactor 416 include a semiconductor diode varactor, a metal-oxide semiconductor capacitor ("MOS-CAP"), and/or a switched-capacitor network. The first frequency tuning circuit 412 and the second frequency tuning circuit 413 each comprise a variable capacitance that "pull" the operating frequency of the resonating element 411 from the natural resonant frequency.

The amplifier 314 of the oscillator 305 comprises any circuitry to control the amplitude of the oscillation signal 307 based upon the control input 317. In the embodiment illustrated in FIG. 4, the amplifier 314 comprises two bipolar transconductance amplifiers operating 180 degrees out of phase to generate, in conjunction with the resonator 311, a tunable oscillation signal 307 that is differential with respect to ground. In other embodiments, the amplifier 314 includes metal-oxide semiconductor ("MOS") transistor circuitry (not shown) and/or operational amplifier ("opamp") circuitry (not shown) in place of bipolar transistor circuitry. In alternative embodiments, the oscillator 305 comprises a single feedback amplifier (not shown) to produce a single-ended oscillation signal 307 in conjunction with the resonator 311.

In the exemplary embodiment of FIG. 4 utilizing a quartz crystal resonating element 411 for optimal phase noise performance in the signal processing circuitry 300 (FIG. 3A) and the comparator 330 (FIG. 3A), the feedback from the amplifier 314 to the quartz crystal resonating element 411 is maintained at less than 1 milliwatt. However, due to wide variance in crystal parameters such as "Reff" for different quartz crystal resonating elements 411, the control input 317 allows for the optimization of the resonator 311 and amplifier 314 for minimum noise generation in the oscillation signal 307. Controlling the control input 317 to change the amplitude of the oscillation signal 307 has only a small impact on noise in the oscillation signal 307.

Figure 5:
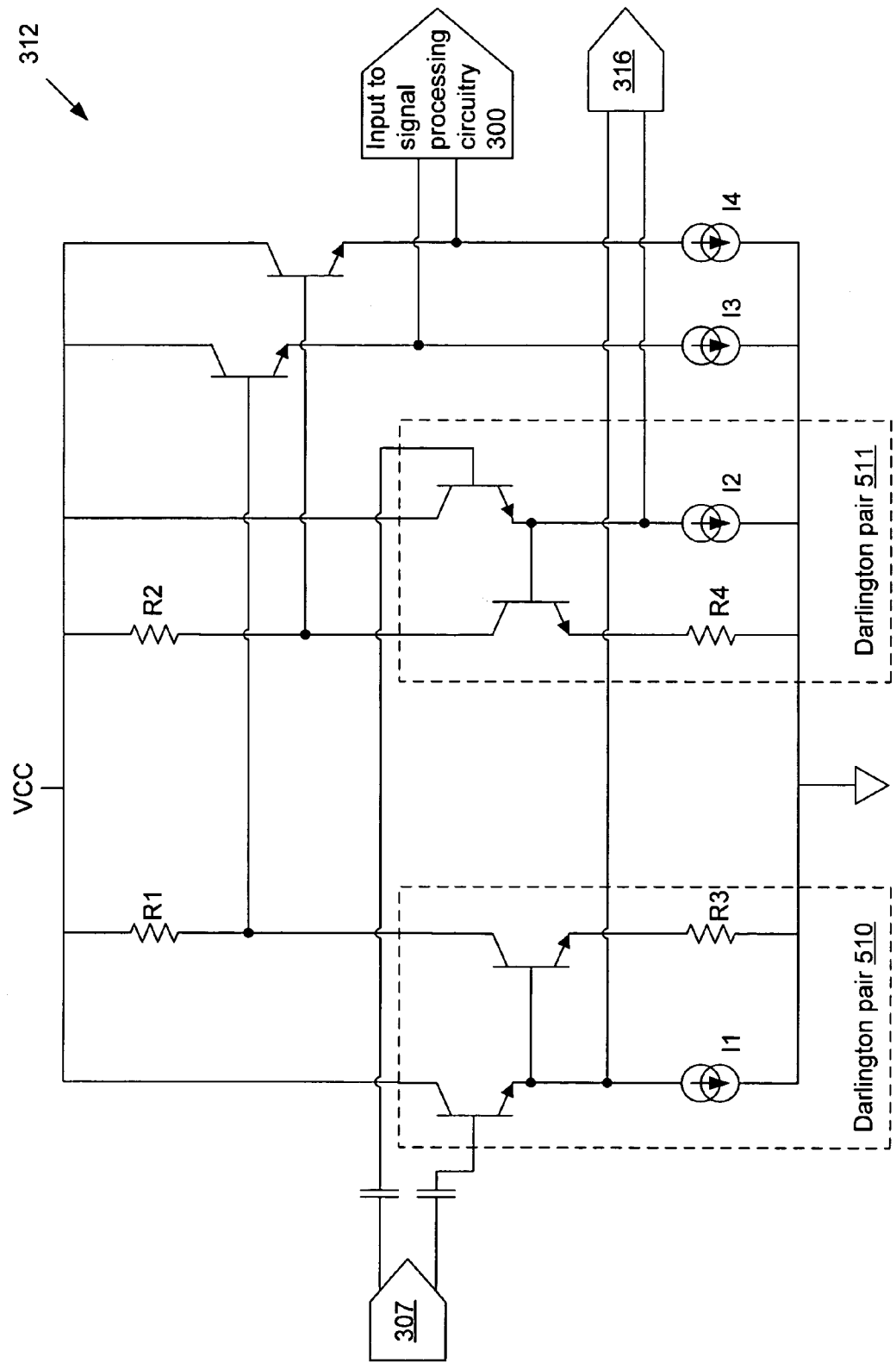
FIG. 5 illustrates a schematic drawing of the buffer of FIG. 3A in one embodiment of the invention.

FIG. 5 illustrates a schematic drawing of the buffer 312 of FIG. 3A in one embodiment of the invention. The buffer 312 of this embodiment is in parallel with the resonator 311 (FIG. 3A), and comprises a first Darlington pair 510 and a second Darlington pair 511 to present a high impedance load to the resonator 311. The high impedance load prevents degradation of the oscillation signal 307 (FIG. 3A). In the exemplary embodiment, resistor R1 and resistor R2 are each 100 ohms, resistor R3 and resistor R4 are each 150 ohms, current I1 and current I2 are each 500 microamps, and current I3 and current I4 are each 2 milliamps.

Figure 6:
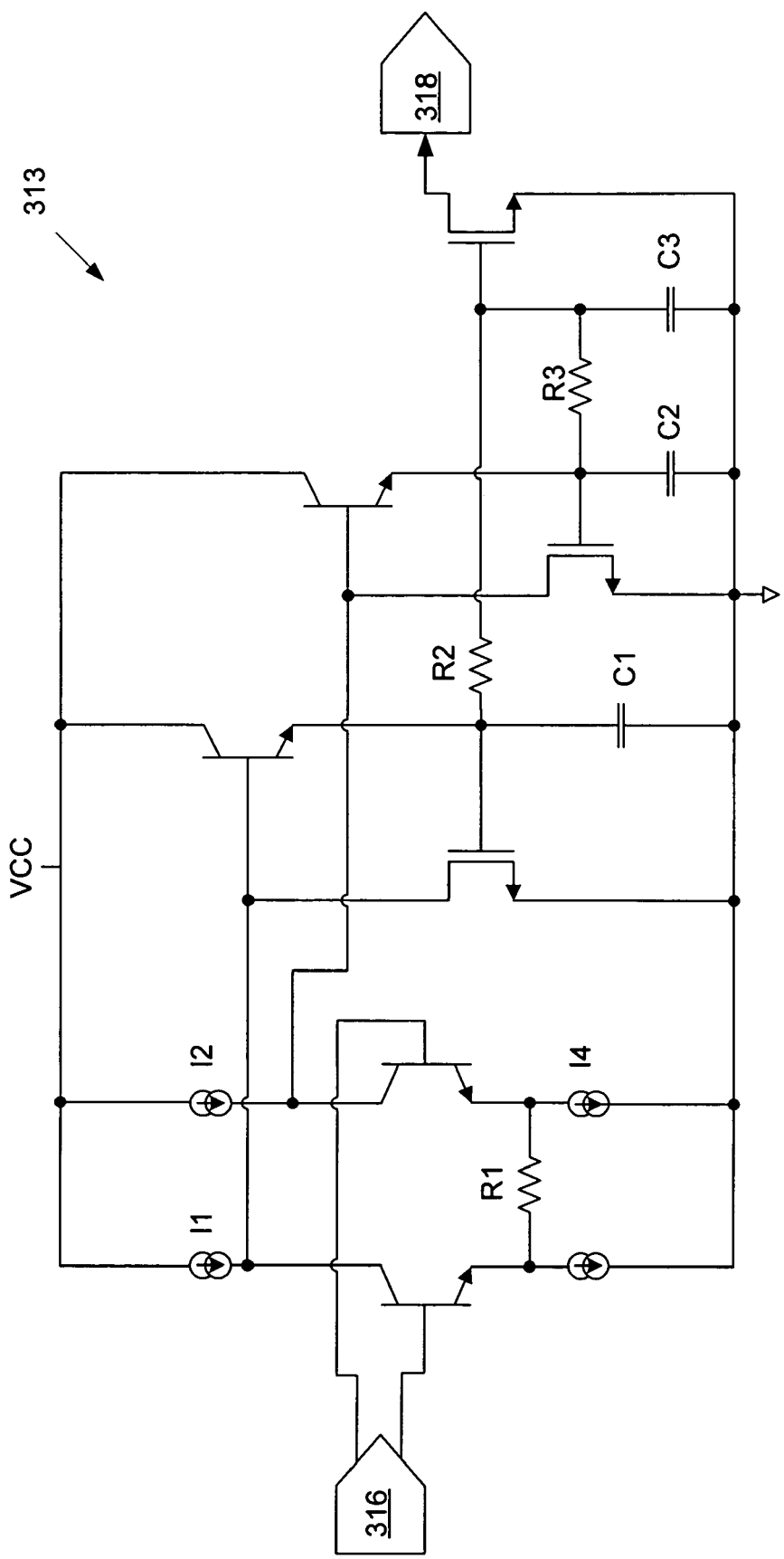
FIG. 6 illustrates a schematic drawing of the peak detector of FIG. 3A in one embodiment of the invention.

FIG. 6 illustrates a schematic drawing of the peak detector 313 of FIG. 3A in one embodiment of the invention. The peak detector 313 is any circuitry to convert the input amplitude of the input 316 (FIG. 3A) to the signal processing circuitry 300 (FIG. 3A) into an input signal 318 (FIG. 3A). In the embodiment of FIG. 6, the input signal 318 comprises an input current. In this embodiment, current I1 and current I2 are each 200 microamps, current I3 and current I4 are each 100 microamps, resistor R1 is 10 kilohms, resistor R2 and resistor R3 are each 3 kilohms, capacitor C1 and capacitor C2 are 5 picofarad, and capacitor C3 is 30 picofarad. As will be appreciated by a skilled artisan, an alternative embodiment of the peak detector 313 comprises MOS transistor circuitry (not shown) and/or opamp circuitry (not shown) in place of bipolar transistor circuitry convert the input amplitude at the input 316 into the input voltage signal for the input signal 318.

Figure 7:
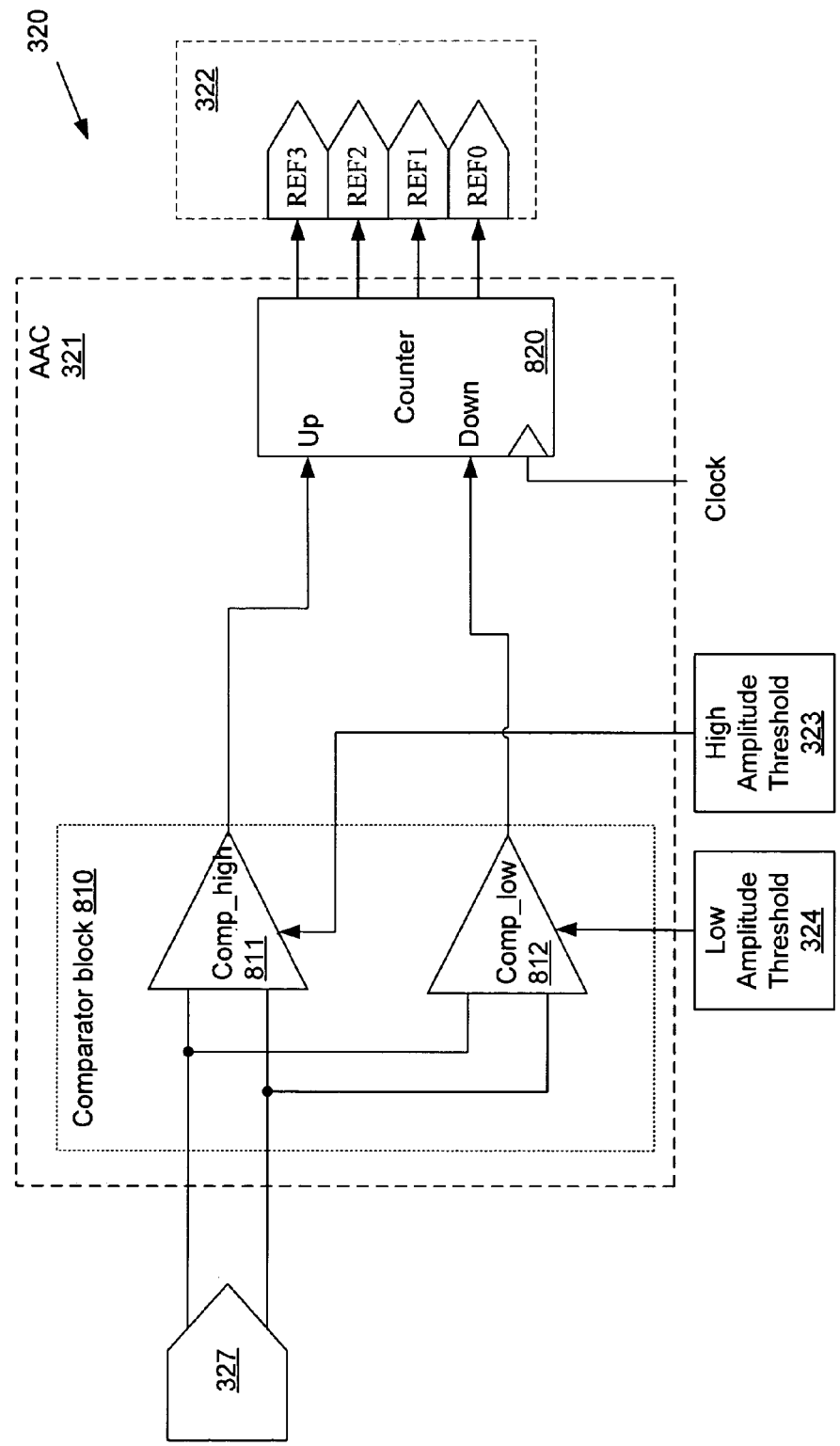
FIG. 7 illustrates a block diagram of the second feedback circuit of FIG. 3A in one embodiment of the invention.

FIG. 7 illustrates a block diagram of the second feedback circuit 320 of FIG. 3A in one embodiment of the invention. The AAC 321 (FIG. 3A) comprises a comparator block 810 and an up/down counter 820 to generate the reference value 322 (FIG. 3A). The reference value 322 of this embodiment comprises a 4-bit digital word. In alternative embodiments, the reference value 322 comprises an analog signal. The comparator block 810 of the AAC 321 compares the output amplitude of the output 327 (FIG. 3A) of the signal processing circuitry 300 (FIG. 3A) with the predetermined range comprising the high amplitude threshold 323 (FIG. 3A) and the low amplitude threshold 324 (FIG. 3A). If the output amplitude of the output 327 is higher than the high amplitude threshold 323, a comp_high comparator 811 in the comparator block 810 outputs a digital "1" and the up/down counter 820 decrements the reference value 322 with each clock pulse. As will be appreciated with respect to the embodiment of the subtractor 315 of FIG. 8 below, decrementing the reference value 322 will lower the oscillation signal 307 and the output amplitude of the output 327. If the output amplitude of the output 327 is lower than the low amplitude threshold 324, a comp_low comparator 812 in the comparator block 810 outputs a digital "1" and the up/down counter 820 increments the reference value 322 with each clock pulse. As will be appreciated with respect to the embodiment of the subtractor 315 of FIG. 8 below, incrementing the reference value 322 will raise the oscillation signal 307 and the output amplitude of the output 327. If the output amplitude of the output 327 is between the high amplitude threshold 323 and the low amplitude threshold 324, the comp_high comparator 811 and the comp_low comparator 812 output a digital "0", preventing the up/down counter 820 from changing the reference value 322. In one embodiment, the high amplitude threshold 323 comprises a pull-up resistor (not shown), and the low amplitude threshold 324 comprises a pull-down resistor (not shown). In other embodiments, the high amplitude threshold 323 and the low amplitude threshold 324 each comprise voltage dividers, programmable values, and/or input signals.

Figure 8:
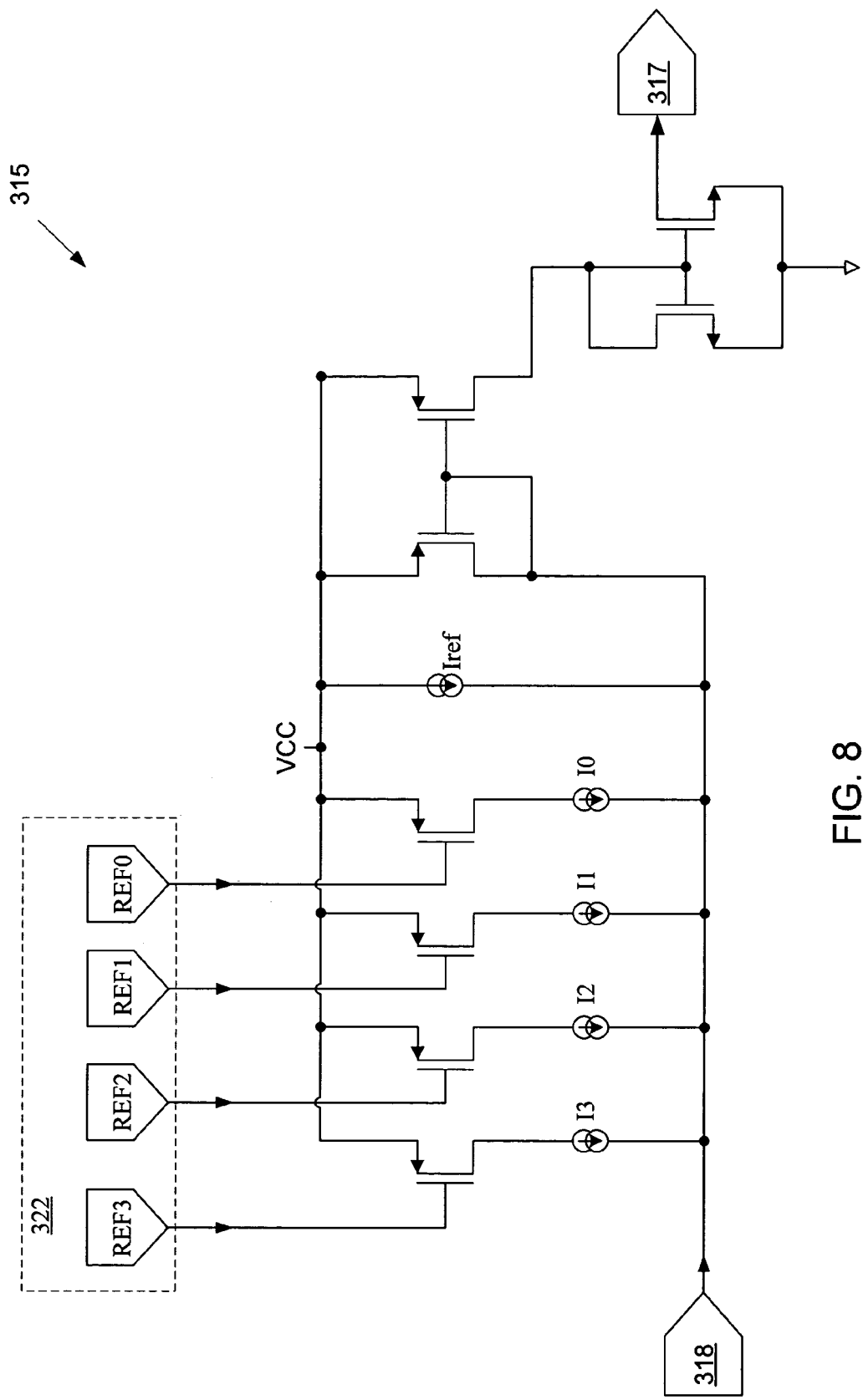
FIG. 8 illustrates a schematic drawing of the subtractor of FIG. 3A in one embodiment of the invention.

FIG. 8 illustrates a schematic drawing of the subtractor 315 of FIG. 3A in one embodiment of the invention. The subtractor 315 is any circuitry to convert the reference value 322 (FIG. 3A) from the AAC 321 (FIG. 3A) into a reference signal, and to compare the input signal 318 (FIG. 3A) from the peak detector 313 to the reference signal so as to generate the control input 317 (FIG. 3A). The resulting control input 317 controls the amplitude of oscillation signal 307 (FIG. 3A) generated in the oscillator 305 (FIG. 3A). It will be appreciated that the circuit of FIG. 8 converts the reference value 322 into a reference current and subtracts the input current of the input signal 318 from the reference current. An alternative embodiment of the subtractor 315 includes MOS transistor circuitry (not shown) and/or opamp circuitry (not shown) in place of bipolar transistor circuitry to convert the reference value 322 (FIG. 3A) to a reference voltage for the reference signal and to compare the input signal 318 from the peak detector 313 to the reference signal.

It will be appreciated that the embodiments of FIGS. 4–8 comprise negative feedback between the output amplitude of the output 327 and the amplitude of the oscillation signal 307. In the first feedback circuit 310, a decrease in the reference value 322 results in a decrease in the amplitude of the oscillation signal 307. In the second feedback circuit 320, an increase in the output amplitude of the output 327 above the predetermined threshold (e.g., due to power supply voltage fluctuation) results in a decrease in the reference value 322. The decrease in the reference value 322 results in a decrease in the amplitude of the oscillation signal 307 and a corresponding decrease in the output amplitude of the output 327. Conversely, a decrease in the output amplitude of the output 327 below the predetermined threshold results in an increase in the reference value 322, an increase in the amplitude of the oscillation signal 307, and a corresponding increase in the output amplitude of the output 327.

The invention has been described above with reference to specific embodiments. Persons skilled in the art, however, will understand that various modifications and changes may be made thereto without departing from the broader spirit and scope of the invention as set forth in the appended claims.

What is claimed is:

1. A circuit for varying an amplitude of an oscillation signal, the circuit comprising:
    an oscillator configured to generate the oscillation signal, the oscillator having a control input to vary the amplitude of the oscillation signal;
    signal processing circuitry configured to process the oscillation signal;
    a first feedback circuit configured to control the control input of the oscillator by comparing a reference value and an input amplitude of an input of the signal processing circuitry; and
    a second feedback circuit configured to generate the reference value by comparing an output amplitude of an output from the signal processing circuitry and a predetermined range.

2. The circuit of claim 1, wherein the first feedback circuit comprises:
    a peak detector configured to convert the input amplitude into an input signal; and
    a subtractor configured to generate the control input by converting the reference value into a reference signal and comparing the input signal and the reference signal.

3. The circuit of claim 1, further comprising an amplifier to control the amplitude of the oscillation signal based upon the control input.

4. The circuit of claim 1, wherein the first feedback circuit comprises:
    a peak detector configured to convert the input amplitude into an input current; and
    a subtractor configured to generate the control input by converting the reference value into a reference current and subtracting the input current from the reference current.

5. The circuit of claim 1, further comprising a transconductance amplifier to control the amplitude of the oscillation signal based upon the control input.

6. The circuit of claim 1, wherein the reference value comprises a digital value.

7. The circuit of claim 1, wherein the predetermined range comprises a high amplitude threshold and a low amplitude threshold.

8. The circuit of claim 1, further comprising a buffer configured to amplify the oscillation signal.

9. The circuit of claim 1, further comprising a comparator configured to convert the output of the signal processing circuitry into a digital waveform.

10. The circuit of claim 9, further comprising an output circuit configured to convert the digital waveform into multiple digital signal formats.

11. The circuit of claim 1, wherein the oscillator further comprises a quartz crystal resonator.

12. The circuit of claim 1, wherein the oscillator further comprises an LC resonator.

13. The circuit of claim 1, wherein the oscillator further comprises a ceramic resonator.

14. The circuit of claim 1, wherein the oscillator further comprises a surface-acoustic wave resonator.

15. A method for varying an amplitude of an oscillation signal, the method comprising:
   generating the oscillation signal in an oscillator having a control input to vary the amplitude of the oscillation signal;
   processing the oscillation signal in signal processing circuitry;
   comparing an output amplitude of an output of the signal processing circuitry to a predetermined range in a second feedback circuit;
   generating a reference value based upon the comparison; and
   controlling the control input of the oscillator in a first feedback circuit based upon the reference value and an input amplitude of an input of the signal processing circuitry.

16. The method of claim 15, wherein the reference value comprises a digital value.

17. The method of claim 15, wherein controlling the control input further comprises:
   converting the input amplitude into an input signal in a peak detector;
   converting the reference value into a reference signal in a subtractor; and
   comparing the input signal and the reference signal.

18. The method of claim 15, wherein controlling the control input further comprises:
   converting the input amplitude into an input current in a peak detector;
   converting the reference value into a reference current in a subtractor; and
   subtracting the input current from the reference current.

19. The method of claim 15, wherein the predetermined range comprises a high amplitude threshold and a low amplitude threshold.

20. The method of claim 15, wherein the amplitude of the oscillation signal is controlled by at least one transconductance amplifier.

21. The method of claim 15, further comprising buffering the signal in a buffer.

22. The method of claim 15, wherein the oscillator comprises a quartz crystal resonator.

23. The method of claim 15, wherein the oscillator comprises an LC resonator.

24. The method of claim 15, wherein the oscillator comprises a ceramic resonator.

25. The method of claim 15, wherein the oscillator comprises a surface-acoustic wave resonator.

26. The method of claim 15, further comprising converting the output of the signal processing circuitry into a digital waveform.

27. The method of claim 26, further comprising converting the digital waveform into multiple digital signal formats.

28. A method for varying an amplitude of an oscillation signal, the method comprising:
   generating the oscillation signal in an oscillator having a control input to vary the amplitude of the oscillation signal;
   processing the oscillation signal in signal processing circuitry;
   controlling the control input of the oscillator in a first feedback circuit based upon a reference value and an input amplitude of an input of the signal processing circuitry;
   comparing an output amplitude of an output of the signal processing circuitry to a predetermined range in a second feedback circuit; and
   generating the reference value based upon the comparison.

* * * * *

UNITED STATES PATENT AND TRADEMARK OFFICE
CERTIFICATE OF CORRECTION

PATENT NO. : 7,098,753 B1  
APPLICATION NO. : 10/856202  
DATED : August 29, 2006  
INVENTOR(S) : Gabriel-Gheorghe Dumitrescu et al.

It is certified that error appears in the above-identified patent and that said Letters Patent is hereby corrected as shown below:

Title page, item (75), "Jon E. Opris, San Jose, CA (US)" should read --"Ion E. Opris, San Jose, CA (US)"--

Signed and Sealed this

Twelfth Day of December, 2006

JON W. DUDAS  
*Director of the United States Patent and Trademark Office*